United States Patent
Yoo et al.

(10) Patent No.: US 8,933,474 B2
(45) Date of Patent: Jan. 13, 2015

(54) LIGHT EMITTING DIODE PACKAGE AND MANUFACTURING METHOD THEREOF

(75) Inventors: Cheol Jun Yoo, Cheonan-si (KR); Young Hee Song, Seongnam-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 62 days.

(21) Appl. No.: 13/564,330

(22) Filed: Aug. 1, 2012

(65) Prior Publication Data
US 2013/0032843 A1 Feb. 7, 2013

(30) Foreign Application Priority Data
Aug. 1, 2011 (KR) .................. 10-2011-0076612

(51) Int. Cl.
*H01L 33/00* (2010.01)
*H01L 33/60* (2010.01)

(52) U.S. Cl.
CPC ...................................... *H01L 33/60* (2013.01)
USPC ................... 257/98; 257/E33.072; 438/27

(58) Field of Classification Search
None
See application file for complete search history.

(56) References Cited

U.S. PATENT DOCUMENTS

| | | | |
|---|---|---|---|
| 6,489,637 B1* | 12/2002 | Sakamoto et al. | 257/98 |
| 2005/0218531 A1* | 10/2005 | Ruhnau et al. | 257/788 |
| 2007/0295980 A1* | 12/2007 | Koya et al. | 257/98 |
| 2010/0164362 A1* | 7/2010 | Miyakawa et al. | 313/498 |
| 2010/0219437 A1* | 9/2010 | Usuda et al. | 257/98 |
| 2010/0224903 A1 | 9/2010 | Cho et al. | |
| 2011/0149594 A1* | 6/2011 | Terajima et al. | 362/606 |

FOREIGN PATENT DOCUMENTS

| | | |
|---|---|---|
| JP | 2010-171116 A | 8/2010 |
| JP | 2010-534413 A | 11/2010 |
| KR | 102009001112 A | 2/2009 |
| WO | WO-2009/014376 A3 | 1/2009 |

* cited by examiner

*Primary Examiner* — Michael Lebentritt
*Assistant Examiner* — Kevin Quinto
(74) *Attorney, Agent, or Firm* — McDermott Will & Emery LLP

(57) ABSTRACT

A light emitting diode (LED) package and a manufacturing method thereof are provided. The LED package includes a substrate including a circuit layer, an LED mounted on the substrate, and a plurality of protruded reflection units disposed in a region excluding an LED mounting region on the substrate and configured to reflect light generated from the LED.

17 Claims, 12 Drawing Sheets

LIGHT EMITTING DIODE PACKAGE AND MANUFACTURING METHOD THEREOF

CROSS-REFERENCE TO RELATED APPLICATION

This application claims the benefit of Korean Patent Application No. 10-2011-0076612, filed on Aug. 1, 2011, in the Korean Intellectual Property Office, the disclosure of which is incorporated herein by reference.

BACKGROUND

1. Field of the Invention

The present disclosure relates to a light emitting diode (LED) package and a manufacturing method thereof, and more particularly, to an LED package for increasing a light extraction efficiency using a large light reflection area, and a manufacturing method thereof.

2. Description of the Related Art

A light emitting diode (LED) package was used in signaling in the initial stages. Recently, the LED package has a wide range of applications such as a back light unit (BLU), and a light source of large-area display devices such as a liquid crystal display (LCD), lighting devices, and the like. In addition, since the LED has a relatively low power consumption and a long lifespan compared to general bulbs or fluorescent lamps, the LED is highly in demand.

The LED package is structured such that an LED is mounted on a substrate and a lens unit is provided at an upper portion of the LED. Generally, light generated from the LED passes through the lens unit and is emitted to the outside. In another implementation, the light may be first reflected from an interface between the lens unit and an air layer, and then reflected from the substrate, to be finally emitted to the outside. In either case, light reflectivity of the substrate is an essential factor to a light extraction efficiency of the LED package, since the substrate has a relatively large surface area compared to the LED. It is desirable to improve the structure of a package substrate to increase a light extraction efficiency of the LED package.

SUMMARY

The present disclosure relates to a light emitting diode (LED) package that increases a light extraction efficiency by increasing a light reflection area and accordingly inducing diffused reflection of light, and a manufacturing method thereof.

An aspect of the present invention encompasses an LED package including a substrate including a circuit layer, an LED mounted on the substrate, and a plurality of protruded reflection units disposed in a region excluding an LED mounting region on the substrate and configured to reflect light generated from the LED.

The plurality of protruded reflection units may have any one shape of a square column, a cylinder, and a cone. The plurality of protruded reflection units may be any one of solder bumps and stud bumps. The plurality of protruded reflection units may include at least one material selected from a metal group consisting of aluminum (Al), gold (Au), silver (Ag), nickel (Ni), platinum (Pt), and titanium (Ti).

The LED package may further include a lens unit applied on the LED.

Another aspect of the present disclosure provides an LED package including a substrate including a circuit layer, a reflective insulation layer disposed on the substrate such that the circuit layer is partially exposed, the reflective insulation layer including a fine uneven pattern; and an LED mounted on the substrate and connected with the partially exposed circuit layer.

The reflective insulation layer may be inclined upward in a direction from an inside to an outside of the substrate. The reflective insulation layer may be inclined downward in a direction from an inside to an outside of the substrate. The reflective insulation layer may include a white solder resist.

The LED package may further include a lens unit applied on the LED.

A till another aspect of the present disclosure provides a method for manufacturing a light emitting diode (LED) package. The manufacturing method provides a substrate that includes a circuit layer, forms a plurality of protruded reflection units in a region excluding an LED mounting region on the circuit layer, and mounts an LED on the LED mounting region.

The forming of the plurality of protruded reflection units may include forming any one of solder bumps or stud bumps in the region excluding the LED mounting region on the circuit layer.

The manufacturing method may further include applying a transparent resin for forming a lens unit on an upper portion of the LED.

According to further another aspect of the present disclosure, a method for manufacturing a light emitting diode (LED) provides a substrate including a circuit layer, and forms a reflective insulation layer disposed on the substrate such that the circuit layer is partially exposed. The reflective insulation layer includes a fine uneven pattern. The method mounts an LED on the partially exposed circuit layer.

The forming of the reflective insulation layer may include applying white solder resist on the substrate that includes the circuit layer, attaching a mold to the white solder resist, the mold including a pattern corresponding to the fine uneven pattern, exposing the white solder resist by aligning a mask on the mold, removing the mold and the mask, and partially exposing the circuit layer by developing the white solder resist.

The forming of the reflective insulation layer may include applying white solder resist on a first film, depositing a second film which includes a pattern corresponding to the fine uneven pattern, on the white solder resist, removing a first film from the white solder resist, bonding one surface of the exposed white solder resist to the substrate including the circuit layer, exposing the white solder resist by aligning a mask on the second film, removing the mask and the second film, and partially exposing the circuit layer by developing the white solder resist.

The reflective insulation layer may be inclined upward from an inside to an outside of the substrate. The reflective insulation layer may be inclined downward from an inside to an outside of the substrate.

The manufacturing method may further include applying a transparent resin for forming a lens unit to an upper portion of the LED.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
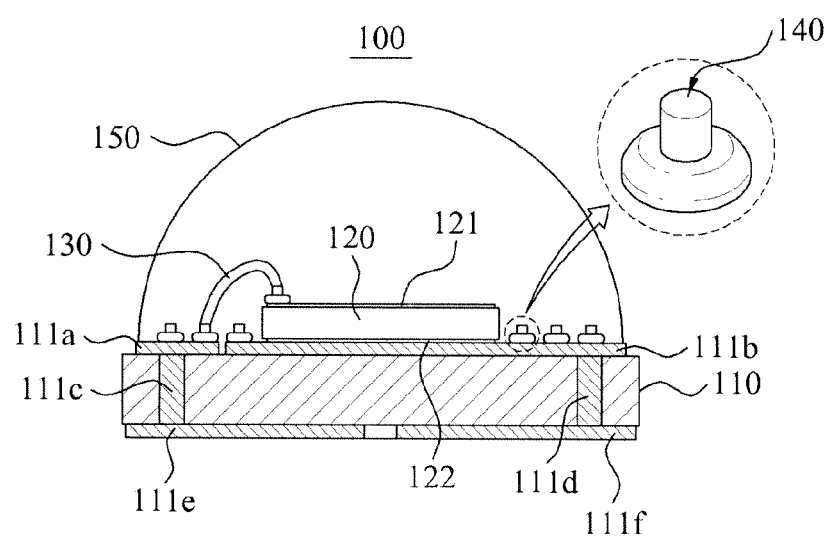
FIGS. 1 and 2 are diagrams illustrating a light emitting diode (LED) package according to an embodiment of the present disclosure.

Reference will now be made in detail to exemplary embodiments of the present disclosure, examples of which are illustrated in the accompanying drawings, wherein like reference numerals refer to the like elements throughout. In the following description, when it is determined that a detailed description of well-known functions related to the present inventive concept, and the construction thereof would make the gist of the present inventive concept obscure, they will be omitted. The terminology used herein is for the purpose of describing particular embodiments only and the definition may be varied according to the intention of a user, an operator, or customs. Therefore, the terms and words should be defined based on a description of this specification.

Figure 2:
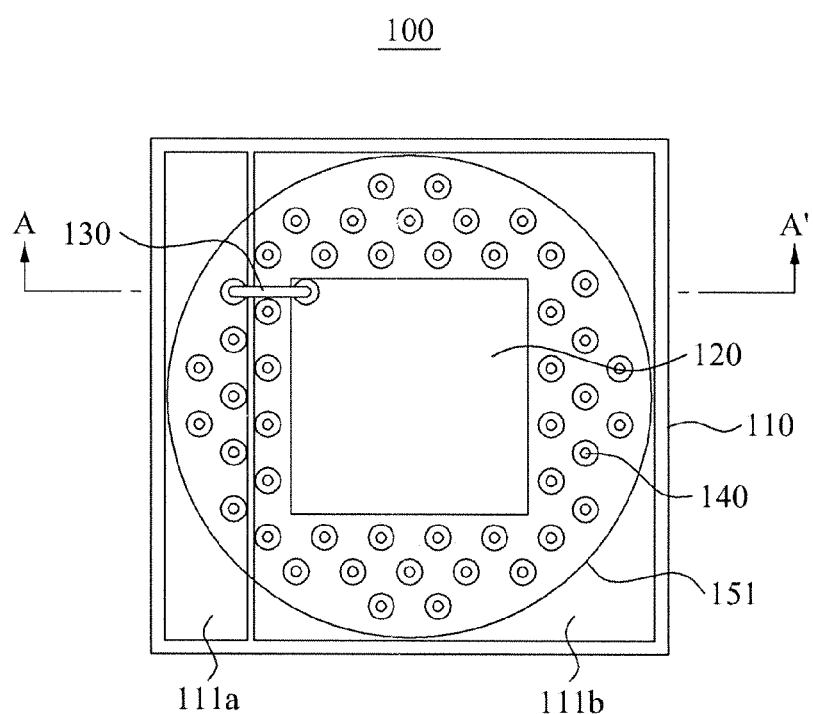

FIGS. 1 and 2 illustrate a light emitting diode (LED) package 100 according to an embodiment of the present disclosure. In particular, FIG. 1 is a sectional view of the LED package 100 shown in FIG. 2, cut along a line A-A'.

Referring to FIGS. 1 and 2, the LED package 100 includes a substrate 110, an LED 120, a plurality of protruded reflection units 140, and a lens unit 150.

The substrate 110 may be an insulating substrate such as a ceramic substrate or an epoxy substrate. The substrate 110 may include a circuit layer.

The circuit layer is provided for electrical connection between the LED 120 and an external circuit, and configured to pass through one surface and the other surface of the substrate 110. That is, the circuit layer includes a first circuit 111a and a second circuit 111b disposed on one surface of the substrate 110, and a third circuit 111e and a fourth circuit 111f disposed on another surface of the substrate 110. In addition, the circuit layer further includes a first via circuit 111c and a second via circuit 111d configured to pass through the substrate 110. However, hereinafter, the first circuit 111a and the second circuit 111b related to the embodiments of the present disclosure will be mainly described and considered as the circuit layer.

The first circuit 111a is disposed on a first region of the substrate 110. The second circuit 111b is disposed on a second region of the substrate 110, being physically separated from the first circuit 111a.

The LED 120 is mounted on the substrate 110. Specifically, the LED 120 may be mounted on the second circuit 111b. In this case, the LED 120 may be a chip having a vertical structure, in which a first electrode 121 and a second electrode 122 are disposed on an upper surface and a lower surface of the LED 120, respectively. Therefore, the second electrode 122 disposed on the lower surface of the LED 120 may be directly connected with the second circuit 111b, whereas the first electrode 121 disposed on the upper surface of the LED 120 is connected with the first circuit 111a through a wire 130.

The plurality of protruded reflection units 140 are disposed in a region excluding the region, in which the LED 120 is mounted, on the substrate 110, so as to reflect light generated from the LED 120. Here, the plurality of protruded reflection units 140 may be formed directly on the substrate 110, or on the first circuit 111a and the second circuit 112b as shown in FIG. 1.

The plurality of protruded reflection units 140 are configured to reflect, toward the lens unit 150, (i) light directed to the substrate 110 out of the light generated from the LED 120 or (ii) light reflected from the lens unit 150 and directed to the substrate 110. The plurality of protruded reflection units 140 may increase a light reflection area of the substrate 110, and efficiently reflect light, owing to the protruded structure. Accordingly, a light extraction efficiency may increase.

The plurality of protruded reflection units 140 may include bumps as shown in an enlarged view of the drawings. In this case, the bumps may be solder bumps or stud bumps.

As an alternative to the bumps, the plurality of protruded reflection units 140 may be provided in any one shape selected from a square column, a cylinder, and a cone. Also, the plurality of protruded reflection units 140 may be provided in any other shape than those describe above, as long as it increases the light reflection area, and has a protruded structure. The plurality of protruded reflection units 140 may include at least one material selected from a metal group consisting of aluminum (Al), gold (Au), silver (Ag), nickel (Ni), platinum (Pt), and titanium (Ti). Also, other metallic materials having similar or equivalent reflectivity characteristics to the aforementioned materials may be used.

The lens unit 150 may be applied on the LED 120 and made of a transparent resin such as silicone resin. The lens unit 150 may further include phosphor particles to convert a wavelength of the light generated from the LED 120.

In FIG. 1, the lens unit 150 is disposed on the substrate 110, which includes the region, on which the LED 120 is mounted. A bonding area between the lens unit 150 and the substrate 110 is increased by the plurality of protruded reflection units 140 formed on the substrate 110. The increase of the bonding area between the lens unit 150 and the substrate 110 strengthens a bonding force between the lens unit 150 and the substrate 110, thereby preventing the lens unit 150 from being separated from the substrate 110.

Figure 3:
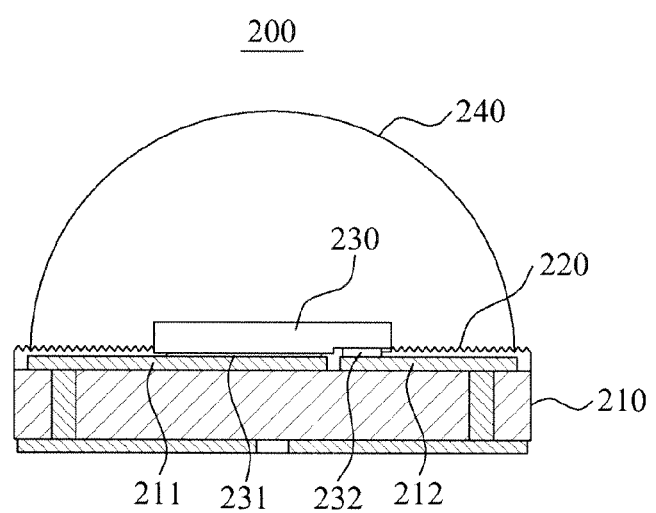
FIGS. 3 and 4 are diagrams illustrating an LED package according to another embodiment of the present disclosure.
Figure 4:
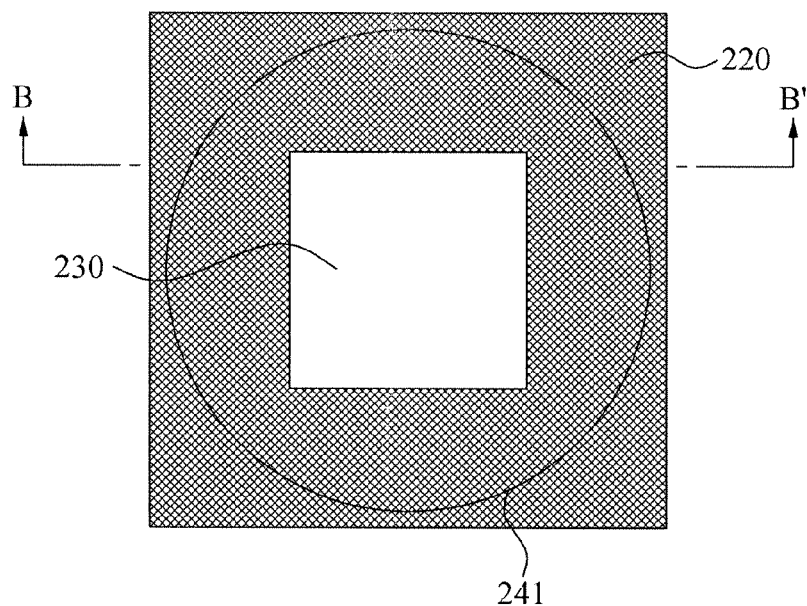

FIGS. 3 and 4 illustrate an LED package 200 according to another embodiment of the present disclosure. Specifically, FIG. 3 is a sectional view of the LED package 200 show in FIG. 4, cut along a line B-B'.

Referring to FIGS. 3 and 4, the LED package 200 includes a substrate 210, a reflective insulation layer 220, an LED 230, and a lens unit 240.

The substrate 210 may be an insulating substrate such as a ceramic substrate or an epoxy substrate. The substrate 210 may include a first circuit layer 211 and a second circuit layer 212.

The first circuit layer 211 may be disposed on a first region of the substrate 210. The second circuit layer 212 may be disposed on a second region of the substrate 210, being physically separated from the first circuit layer 211.

The reflective insulation layer 220 is disposed on the substrate 210 to partially expose the first circuit layer 211 and the second circuit layer 212, and includes a fine uneven pattern. That is, the reflective insulation layer 220 is disposed in a region excluding the region in which the LED 230 is disposed, on the substrate 210. Therefore, in the region in which the LED 230 is disposed, the first circuit layer 211 and the second circuit layer 212 may be partially exposed.

The LED 230 is mounted on the first circuit layer 211 and the second circuit layer 212 that is partially exposed through the reflective insulation layer 220. A first electrode and a second electrode mounted to one surface of the LED 230 may be flip-chip bonded to the first circuit layer 211 and the second circuit layer 212, respectively.

The reflective insulation layer 220 may include white solder resist having reflectivity. Accordingly, the reflective insulation layer 220 may reflect light directed to the substrate 210 out of the light generated from the LED 230, toward the lens unit 240.

In addition, the reflective insulation layer 220 increases a light reflection area by including the fine uneven pattern while efficiently reflecting light using the uneven structure. As a result, the light reflectivity may be increased. In the fine uneven pattern, heights and intervals of patterns may be regular or irregular.

The lens unit 240 may be applied on the LED 230. The lens unit 240 is disposed on the substrate 210 including the region in which the LED 230 is mounted. Due to the fine uneven pattern of the reflective insulation layer 220 disposed on the substrate 210, a bonding area between the lens unit 240 and the substrate 210 is increased. The increased bonding area strengthens a bonding force between the lens unit 240 and the substrate 210.

Figure 5:
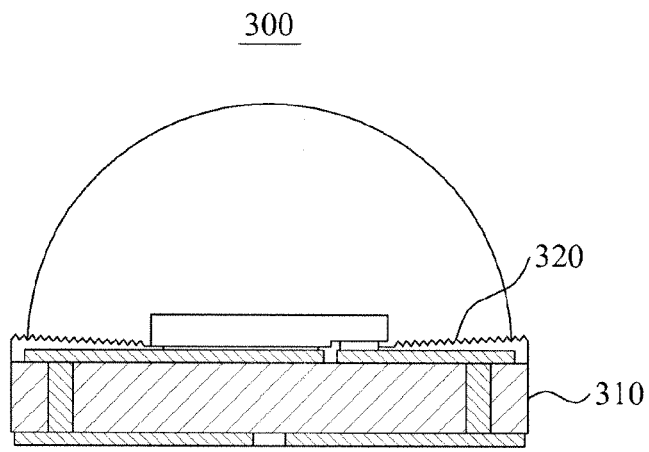
FIGS. 5 and 6 are diagrams illustrating LED packages according to still other embodiments of the present disclosure.
Figure 6:
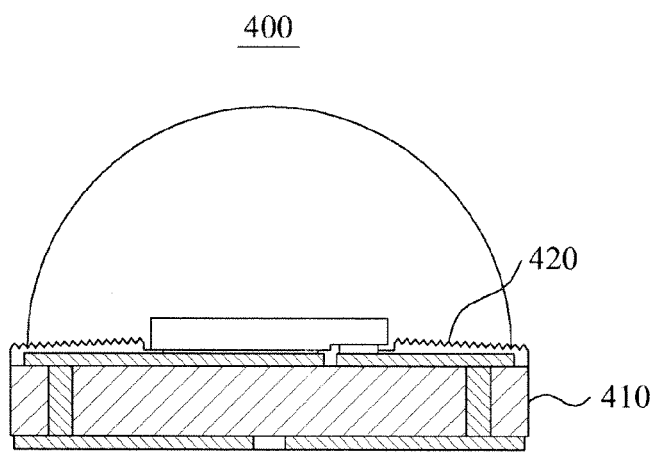

FIGS. 5 and 6 illustrate LED packages 300 and 400 according to still other embodiments of the present disclosure.

The LED packages 300 and 400 shown in FIGS. 5 and 6 have almost the same structure as the LED package 200 shown in FIGS. 3 and 4. However, the LED packages 300 and 400 have modified reflective insulation layers 320 and 420 when compared to the LED package 200.

Referring to FIG. 5, the reflective insulation layer 320 of the LED package 300 is disposed on a substrate 310. The reflective insulation layer 320 may be inclined upward in a direction from an inside to an outside of the substrate 310.

Referring to FIG. 6, the reflective insulation layer 420 of the LED package 400 is disposed on a substrate 410. The reflective insulation layer 420 may be inclined downward in a direction from an inside to an outside of the substrate 410.

Since the reflective insulation layers 320 and 420 have the inclined structure as shown in FIGS. 5 and 6, an angle and direction of light being emitted may be adjusted according to a degree and direction of the inclination.

In addition, as shown in FIGS. 5 and 6, the reflective insulation layers 320 and 420 may have a tapered structure or a step structure having a gradually increasing or decreasing height in a direction from the inside to the outside of the substrates 310 and 410.

FIGS. 7 to 10 illustrate a method for manufacturing an LED package 500, according to an embodiment of the present disclosure.

Figure 7:
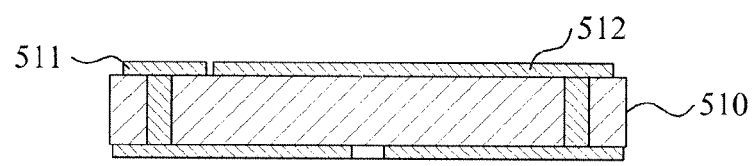
FIGS. 7 to 10 are diagrams illustrating a manufacturing method for an LED package, according to an embodiment of the present disclosure.

Referring to FIG. 7, the manufacturing method includes providing a substrate 510 including a first circuit layer 511 and a second circuit layer 512. The substrate 510 may be any one of a ceramic substrate, an epoxy substrate, and a printed circuit board (PCB).

Figure 8:
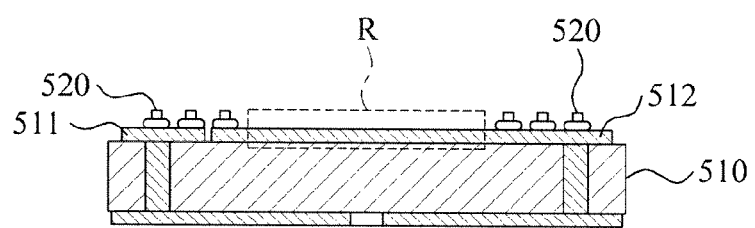

Referring to FIG. 8, the manufacturing method may include forming a plurality of protruded reflection units 520 in a region excluding an LED mounting region R on the first circuit layer 511 and the second circuit layer 512.

The plurality of protruded reflection units 520 may be any of solder bumps and stud bumps.

The solder bumps may be formed by attaching metallic wire balls to the first circuit layer 511 and the second circuit layer 512, or by vapor-depositing, electrolytic plating, or screen-printing a metallic material such as Au-tin (Sn).

The stud bumps may be formed by forming Au wire balls using a capillary and cutting an end of each Au wire ball.

Alternatively, the plurality of protruded reflection units 520 may be provided in any one shape of a square column, a cylinder, and a cone.

The square column, the cylinder, and the cone may include at least one selected from a metal group consisting of Au, Ag, Ni, Pt, and Ti. Additionally, the square column, the cylinder, and the cone may be formed by vapor-depositing and patterning a metallic material.

Figure 9:
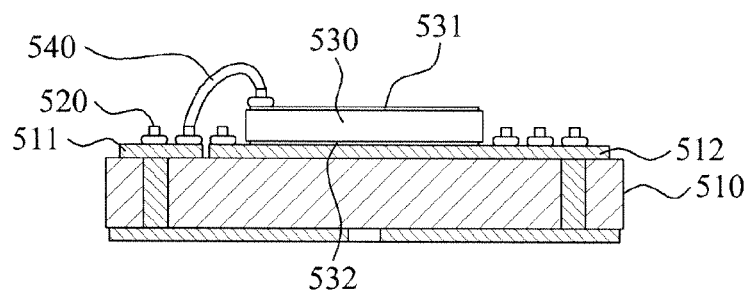

Referring to FIG. 9, the manufacturing method may include mounting an LED 530 in the LED mounting region R. Prior to the mounting of the LED 530, a metallic adhesive may be applied on the LED mounting region R.

The LED 530 may have a vertical structure in which a first electrode 531 and a second electrode 532 are disposed on an upper surface and a lower surface of the LED 530, respectively. The first electrode 532 disposed on the upper surface may be connected to any one of the plurality of protruded reflection units 520 by a wire 540. The second electrode 533 disposed on the lower surface may be directly connected to the second circuit layer 512.

Figure 10:
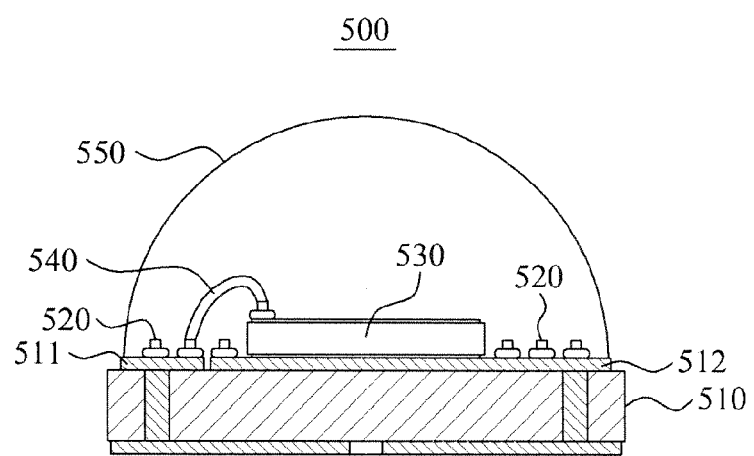

Referring to FIG. 10, the manufacturing method may include forming a lens unit 550. The lens unit 550 may be formed by applying a transparent resin on a region including the LED 530 on the substrate 510. Here, the applied transparent resin may be cured.

The transparent resin may be silicone resin or epoxy resin. Also, the transparent resin may include phosphor particles for converting a wavelength of light generated from the LED 530.

The LED package 500 shown in FIG. 10 may increase the light extraction efficiency by having a relatively large light reflection area due to the existence of the plurality of protruded reflection units 520. Also, a bonding force between the substrate 510 and the lens unit 550 may be increased by the plurality of protruded reflection units 520.

Although the LED package 500 is illustrated and described to be manufactured in a chip level in FIGS. 7 to 10, the LED package may be manufactured in a large-scale substrate level.

FIGS. 11 to 16 are diagrams illustrating a manufacturing method for an LED package according to another embodiment of the present disclosure.

Figure 11:
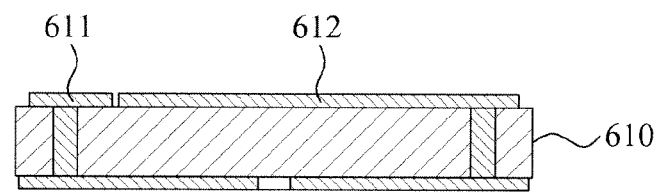
FIGS. 11 to 16 are diagrams illustrating a manufacturing method for an LED package, according to another embodiment of the present disclosure.

Referring to FIG. 11, the manufacturing method may include providing a substrate 610 including a first circuit layer 611 and a second circuit layer 612. Next, a reflective insulation layer may be formed on the substrate 610.

FIGS. 12 to 15 are diagrams for describing a method for manufacturing the reflective insulation layer according to another embodiment of the present disclosure.

Figure 12:
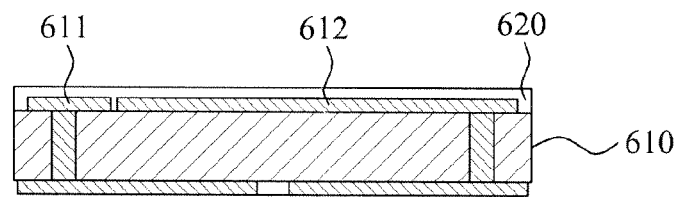

Referring to FIG. 12, the manufacturing method may include applying white solder resist 620 on the substrate 610, on which the first circuit layer 611 and the second circuit layer 612 are disposed. The white solder resist 620 has light reflectivity and insulation. The white solder resist may be applied by a printing method and may be pre-cured to remove a solvent substance after the application.

Figure 13:
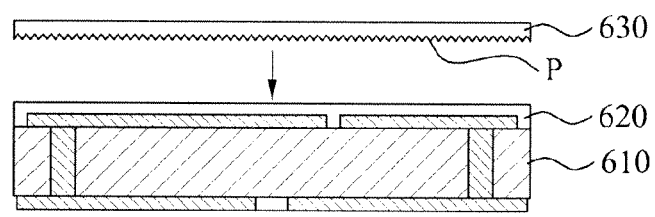

Referring to FIG. 13, the manufacturing method may include attaching a mold 630 on the white solder resist 620 shown in FIG. 12. One surface of the mold 630 may include a pattern P corresponding to the fine uneven pattern to be formed on the white solder resist. Therefore, when the mold 630 is pressed with the one surface attached to the white solder resist 620, the pattern P is transferred to the white solder resist 620, accordingly forming the fine uneven pattern on the white solder resist 620.

The mold 630 may have light transmittance in order to pass ultraviolet (UV) rays and transfer the UV rays to the white solder resist 620 during an exposure operation that will be performed next. In addition, the surface of the mold 630 including the pattern P may be applied with a release agent for easy separation of the mold 630 from the white solder resist 620.

Figure 14:
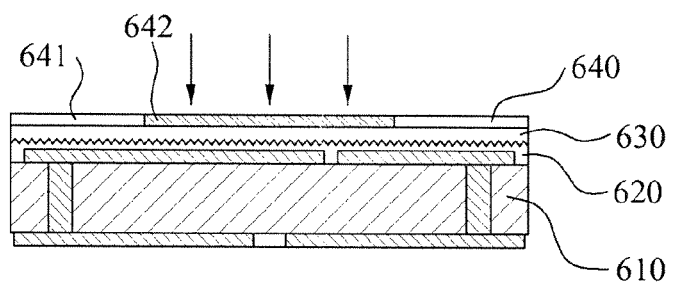

Referring to FIG. 14, the manufacturing method may include exposing the white solder resist 620 and the mold 630 in a state where a mask 640 is aligned on an upper portion of the mold 630.

The mask 640 is used when the UV rays from an exposure device (not shown) are emitted to the white solder resist 620. The mask 640 may include a pattern divided into a light blocking region 641 and a light transmitting region 642. Therefore, the UV rays may pass through the light transmitting region 642 and be emitted only to an LED mounting region of the white solder resist 620. Therefore, in a following operation, only a portion of the white solder resist 620, to which the UV rays are emitted, 620 may be selectively removed.

Figure 15:
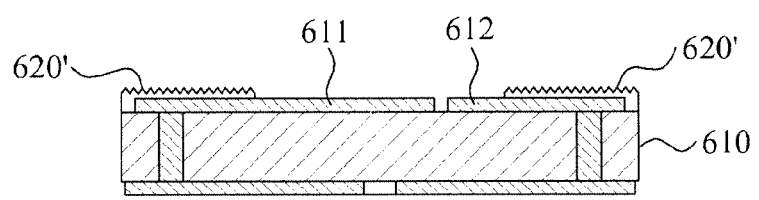
Figure 16:
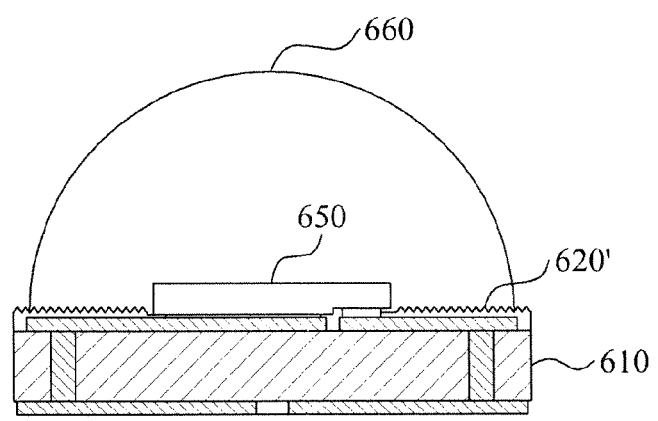

Referring to FIG. 15, the manufacturing method may include removing the mask 640 and the mold 630 and then forming a reflective insulation layer 620' by developing the white solder resist 620, after the exposure operation.

The reflective insulation layer 620' may partially expose the first circuit layer 611 and the second circuit layer 612 disposed on the substrate 610.

As shown in FIGS. 12 to 15, the reflective insulation layer 620' may be formed by applying the white solder resist 620 on the substrate 610. Alternatively, the white solder resist 620 may be applied to a dedicated film and the film may be attached to the substrate 610, thereby forming the reflective insulation layer 620'. Such an embodiment will be described in detail with reference to 17 to 20.

FIGS. 17 to 20 illustrate a method for forming a reflective insulation layer, according to still another embodiment of the present disclosure.

Figure 17:
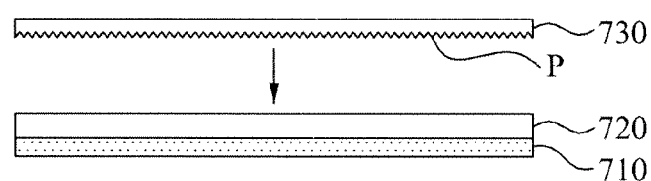
FIGS. 17 to 20 are diagrams illustrating a method for forming a reflective insulation layer, according to still another embodiment of the present disclosure.
Figure 18:
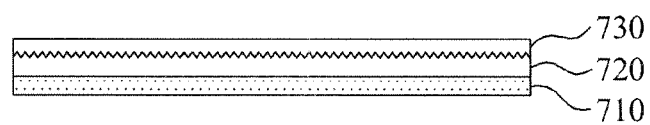

Referring to FIG. 17, the manufacturing method may include applying white solder resist 720 on a first film 710 and attaching a second film 730. A pre-procuring operation may be additionally performed after the white solder resist 720 is applied on the first film 710. As a result, a structure in which the white solder resist 720 and the second film 730 are deposited on the first film 710 may be formed as shown in FIG. 18.

Here, the first film 710 functions as a support plate for application of the white solder resist 720. The second film 730 functions as a mold for forming a fine uneven pattern on the white solder resist 720. That is, the second film 730 may have the same structure as the mold 630 shown in FIG. 13. Therefore, the second film 730 may include a pattern P corresponding to the fine uneven pattern to be formed at the white solder resist 720 (See FIG. 17).

Figure 19:
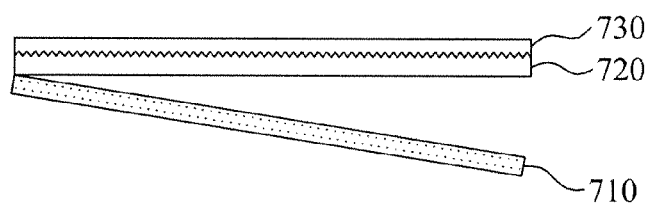

Referring to FIG. 19, the manufacturing method may include removing the first film 710 from the white solder resist 720. The first film 710 may be removed by wet etching or dry etching. The removal of the first film 710 causes the second film 730 and the white solder resist 720 to remain.

Figure 20:
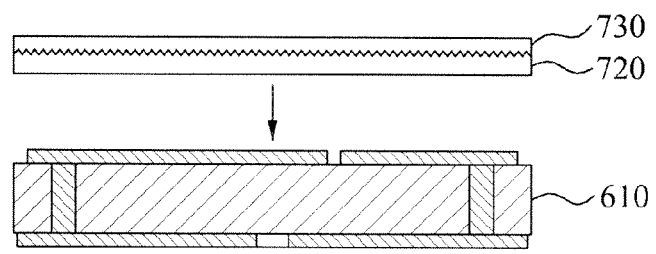

Referring to FIG. 20, the manufacturing method may include attaching the second film 730 and the white solder resist 720 shown in FIG. 19 to the substrate 610 shown in FIG. 11. Next, the same operations as described with reference to FIGS. 14 and 15 are performed to form the reflective insulation layer.

When the reflective insulation layer 620' is formed on the substrate 610 as shown in FIG. 15, an LED 650 is mounted. Specifically, referring to FIG. 16, the manufacturing method may include flip-chip mounting the LED 650 on the first circuit layer 611 and the second circuit layer 612 that is partially exposed through the reflective insulation layer 620'. After mounting of the LED 650, a lens unit 660 may be formed by applying a transparent resin to an upper portion of the LED 650.

Although a few exemplary embodiments of the present disclosure have been shown and described, the present inventive concept is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A light emitting diode (LED) package, comprising:
a substrate including a circuit layer;
an LED mounted on the substrate;
a plurality of protruding reflection units disposed in a region excluding an LED mounting region on the substrate, and configured to reflect light generated from the LED; and
a first circuit disposed on the substrate and a second circuit disposed on the substrate, separated from each other,
wherein the plurality of protruding reflection units are disposed on the first circuit and the second circuit, and the LED is disposed on one of the first circuit and the second circuit.

2. The LED package of claim 1, wherein the plurality of protruding reflection units have any one shape selected from a square column, a cylinder, and a cone.

3. The LED package of claim 1, wherein the plurality of protruding reflection units are any one of solder bumps and stud bumps.

4. The LED package of claim 1, wherein the plurality of protruding reflection units comprises at least one material selected from a metal group consisting of aluminum (Al), gold (Au), silver (Ag), nickel (Ni), platinum (Pt), and titanium (Ti).

5. A light emitting diode (LED) package, comprising:
a substrate including a circuit layer;
a reflective insulation layer disposed on the substrate such that the circuit layer is partially exposed, the reflective insulation layer including a fine uneven pattern;
an LED mounted on the substrate and connected with the partially exposed circuit layer; and
a first circuit disposed on the substrate and a second circuit disposed on the substrate, separated from each other,
wherein the plurality of protruding reflection units are disposed on the first circuit and the second circuit, and the LED is disposed on one of the first circuit and the second circuit.

6. The LED package of claim 5, wherein the reflective insulation layer is inclined upward in a direction from an inside to an outside of the substrate.

7. The LED package of claim 5, wherein the reflective insulation layer is inclined downward in a direction from an inside to an outside of the substrate.

8. The LED package of claim 5, wherein the reflective insulation layer comprises a white solder resist.

9. The LED package of claim 5, wherein the circuit layer includes a first circuit layer and a second circuit layer disposed on one surface of the substrate, separate from each other, and the LED is disposed on the first circuit layer and the second circuit layer.

10. The LED package of claim 9, wherein the reflective insulation layer is disposed on the one surface of the substrate excluding the region of the one surface on which the LED is disposed.

11. A method for manufacturing a light emitting diode (LED) package, the manufacturing method comprising:
providing a substrate having a circuit layer on one surface thereof;
forming a plurality of protruding reflection units in a region excluding an LED mounting region on the circuit layer; and
mounting an LED on the LED mounting region; and
forming a first circuit and a second circuit on the substrate to be separated from each other,
wherein the plurality of protruding reflection units are disposed on the first circuit and the second circuit, and the LED is disposed on one of the first circuit and the second circuit.

12. The method of claim 11, wherein the forming of the plurality of protruding reflection units comprises:
forming any one of solder bumps or stud bumps in the region excluding the LED mounting region on the circuit layer.

13. The method of claim 11, further comprising:
applying a transparent resin for forming a lens unit to an upper portion of the LED.

14. A method for manufacturing a light emitting diode (LED) comprising:
providing a substrate having a circuit layer disposed on one surface of the substrate;
forming white solder resist on the substrate and the circuit layer;
developing the white solder resist to form, on the substrate, a reflective insulation layer including a fine uneven pattern and to partially expose the circuit layer; and
mounting an LED on the partially exposed circuit layer,
wherein the developing of the white solder resist comprises:
applying the white solder resist on the substrate that includes the circuit layer;
attaching a mold to the white solder resist, the mold including a pattern corresponding to the fine uneven pattern;
exposing the white solder resist by aligning a mask on the mold; and
removing the mask and the mold.

15. The method of claim 14, wherein the reflective insulation layer is inclined upward from an inside to an outside of the substrate.

16. The method of claim 14, wherein the reflective insulation layer is inclined downward from an inside to an outside of the substrate.

17. The method of claim 14, further comprising:
applying a transparent resin for forming a lens unit to an upper portion of the LED.

* * * * *